United States Patent [19]

Sakai et al.

[11] 4,179,317

[45] Dec. 18, 1979

[54] METHOD FOR PRODUCING COMPOUND SEMICONDUCTOR CRYSTALS

[75] Inventors: Kazuo Sakai, Tokyo; Shigeyuki Akiba, Tanashi; Takaya Yamamoto, Niza, all of Japan

[73] Assignee: Kokusai Denshin Denwa Kabushiki Kaisha, Japan

[21] Appl. No.: 909,498

[22] Filed: May 25, 1978

[30] Foreign Application Priority Data

May 31, 1977 [JP] Japan .................................. 52/62853

[51] Int. Cl.$^2$ ......................................... H01L 21/208
[52] U.S. Cl. ..................................... 148/171; 148/172
[58] Field of Search ............................... 148/171, 172

[56] References Cited

U.S. PATENT DOCUMENTS

| | | | |
|---|---|---|---|
| 3,533,856 | 10/1970 | Panish et al. | 148/1.5 |
| 3,631,836 | 1/1972 | Jarvela et al. | 118/415 |
| 3,759,759 | 9/1973 | Solomon | 148/171 |
| 3,891,478 | 6/1975 | Ladany et al. | 148/171 |
| 3,997,377 | 12/1976 | Izawa et al. | 148/172 |
| 4,088,514 | 5/1978 | Hara et al. | 148/171 |

*Primary Examiner*—G. Ozaki
*Attorney, Agent, or Firm*—Robert E. Burns; Emmanuel J. Lobato; Bruce L. Adams

[57] ABSTRACT

A method for producing III-V compound semiconductor crystals using a liquid phase epitaxial growth, in which the crystal growth is achieved in a state in which a single crystal of the same composition as a single crystal serving as a substrate for crystal precipitation is present in a melt for the liquid growth.

5 Claims, 5 Drawing Figures

METHOD FOR PRODUCING COMPOUND SEMICONDUCTOR CRYSTALS

BACKGROUND OF THE INVENTION

This invention relates to a method for liquid phase epitaxial growth of III-V compound semiconductor materials.

Generally, when making a light emitting diode, a laser diode, a transistor or a similar semiconductor electronic device from a crystal having different kinds of semiconductor layers, it is necessary to minimize stress due to a difference between lattice constants of different kinds of semiconductor layers so as to ensure a stable operation of the electronic device for a long time. For instance, in connection with a GaAs/GaAlAs double hetero-structure laser, it has been reported that the stress arising from a difference between lattice constants of the GaAs layer, which is an active region performing laser oscillation, and each of the GaAlAs layers on both sides of the GaAs layer introduces lattice defects and imposes a limitation on the lifetime of the laser element (Journal of Institute of Electronics and Communication Engineers of Japan, 1975, Vol. 57, No. 7, pp. 835-842). Accordingly, it is of prime importance for enhancement of reliability of the device to minimize the stress resulting from a lattice constant difference between such different kinds of semiconductor layers.

Incidentally, in a case of a compound semiconductor crystal consisting of three or more constitutent elements, the lattice constant can be changed by altering the relative amounts of the constituent elements. By way of example, in a case of growing $In_xGa_{1-x}As_yP_{1-y}$ on an InP substrate, it is possible to grow on the InP substrate a single crystal of $In_xGa_{1-x}As_yP_{1-y}$ with the lattice constant held equal or close to that of the substrate. In this instance, the wavelength of radiation or laser oscillation of the $In_xGa_{1-x}As_yP_{1-y}$ single crystal covers as wide a range as 1.0 to 1.7 $\mu$m. For growing such a crystal as $In_xGa_{1-x}As_yP_{1-y}$ with good reproducibility by accurately controlling the lattice constant, the temperature and composition ratio of the melt during growth must be placed under accurate control.

In a case of forming the $In_xGa_{1-x}As_yP_{1-y}$ layer on the InP substrate, it is the practice in the prior art to prepare first a melt for the crystal growth by a method (1) which obtains a saturated melt with raw materials accurately weighed so that the components In, Ga, As and P may have experimental values obtained in advance, or a method (2) which obtains a melt with the raw materials accurately weighed so that after the components In, Ga and As may have experimental values obtained previously, P is saturated therein using $PH_3$, $PCl_3$ or InP. Then, the melt thus obtained, after being cooled to a supercooled state, is contacted with a substrate to achieve thereon the crystal growth. The method (1) has a defect of difficulty in obtaining the composition ratio of the melt for defining a proper value of the lattice constant difference. With the method (2), since the composition ratio of P is automatically determined in the course of saturation, a proper composition ratio of the melt can be obtained more easily than in the case of the method (1). However, this method involves a process of causing a chemical reaction of such a substance as $PH_3$ or $PCl_3$ at a high temperature to liberate and dissolve P in the solution, or in the case of saturating P using InP, calls for a process of separating the InP from the melt after completion of the saturation of P by the use of a special boat for the crystal growth, or a special crystal growth device.

Further, each of the two methods (1) and (2) has a defect that crystal precipitates may be generated by some causes in the melt before the melt reaches a predetermined supercooled state, making it impossible to control with good reproducibility the composition ratio of the melt at the start of crystal growth on the substrate.

SUMMARY OF THE INVENTION

Accordingly, an object of this invention is to provide a method for producing compound semiconductor crystals in which, the composition ratio of the melt at the start of crystal growth on the substrate can be easily controlled with excellent reproducibility in the liquid phase epitaxial growth of a semiconductor crystal.

This invention is based on the fact that the crystal growth speed on a single crystal plane of constant Miller indices has good reproducibility. For example, in a case of achieving the crystal growth using a saturated melt with no suspended matter therein, the solution, as cooled, becomes supercooled and crystals begin to precipitate about nuclei which are formed by some causes. The degree of precipitation depends upon the formation of nuclei. As a result of this, the composition ratio of the melt at the start of crystal growth fluctuates with growing operations, which leads to difficulties in obtaining grown crystals with good reproducibility. Further, also in a case where a polycrystal is present as a suspended matter in the saturated melt, the degree of precipitation of the suspended matter on the polycrystal in the course of cooling the melt is dependent upon the state of the plane of the polycrystal. Therefore, it is difficult to obtain with good reproducibility the composition ratio of the melt at the start of crystal growth on the substrate. However, in a case where a single crystal of the same composition as the substrate exists in the saturated melt, precipitation occurs on the single crystal in the process of cooling the melt. If the Miller indices and the area of the plane of the single crystal in the melt are selected to be constant, the degree of precipitation on the single crystal becomes constant for each growing operation and the composition ratio of the melt at the start of crystal growth can be readily controlled with excellent reproducibility.

BRIEF DESCRIPTION OF THE DRAWINGS

This invention will be described in detail with reference to the accompanying drawings, in which.

DESCRIPTION OF THE PREFERRED EMBODIMENTS

Figure 1:
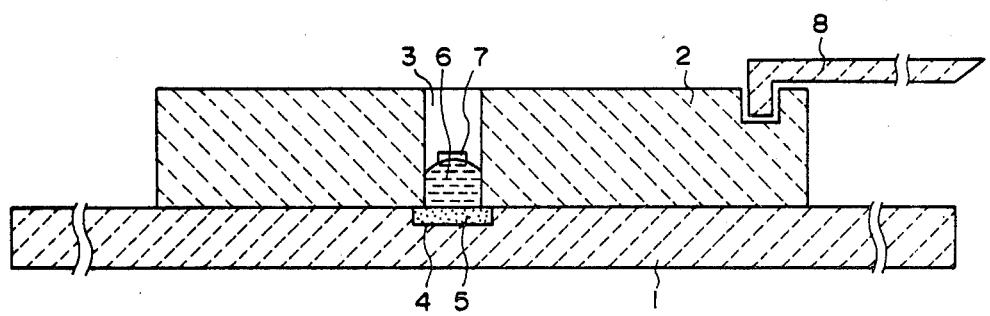
FIG. 1 is a longitudinal section illustrating an example of a crystal growing device for use in this invention.

With reference to FIG. 1, an example of a crystal growing device embodying the liquid phase epitaxial growth method of this invention will first be described. This device is composed of a substrate support 1 having a groove 5 for housing a substrate crystal 4 and a slide plate 2 which is slidable on the top of the support 1 and has a melt reservoir 3. The liquid phase epitaxial growth of $In_xGa_{1-x}As_yP_{1-y}$, using this device, was carried out in the following manner. As InP single crystal (having a Miller index (100) plane) is put in the substrate crystal housing groove 5 and an In sample of 2 g, a GaAs sample of 25 mg, an InAs polycrystal sample of 100 to 145 mg and an InP single crystal sample of 20 mg (a plane having a Miller index of (100) and a thickness of 360 μm) are put in the melt reservoir 3. This device is placed in an epitaxial growth furnace and heated at 675° C. in a stream of hydrogen for an hour, thereby to saturate the Ga, As and P in the In. In this case, the GaAs polycrystal and the InAs polycrystal are entirely fused but the InP single crystal 7 is fused only by a certain value defined by the In, Ga and As concentrations in the melt and the remainder exists in the form of single crystal in the melt. Next, the temperature is lowered at the rate of 0.7° C./sec. to make the melt supercooled, and is further lowered to precipitate crystals onto the InP single crystal 7 in the solution. During this operation, the slide plate 2 is moved by a moving rod 8 in such a manner that the melt reservoir 3 may overlie the substrate crystal 4, i.e. InP, at the moment of the temperature having reached 633° C., thereby to contact the substrate crystal 4 with the melt 6 for the crystal growth. At the time when the predetermined crystal growth has been obtained, the slide plate 2 is moved again to stop the crystal growth.

Figure 2:
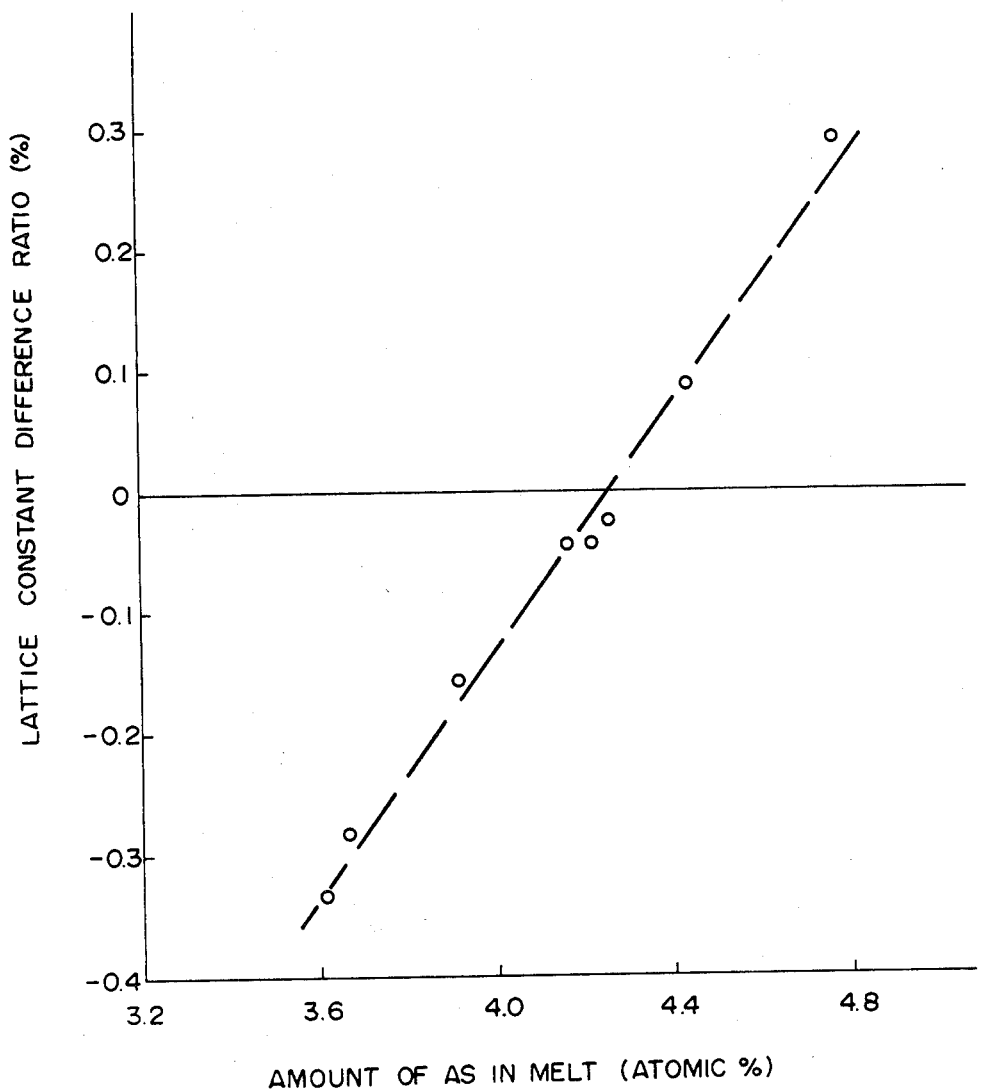
FIG. 2 is a graph showing the relationship of the lattice constant difference between a grown layer and a substrate to the quantity of As in a solution.

FIG. 2 shows, in the terms of a function of the amount of As (in atomic percentage) dissolved in the melt, the measured values of the lattic constant difference ratio of the $In_xGa_{1-x}As_yP_{1-y}$ crystal grown by the abovesaid method of this invention to the InP substrate crystal, that is, (lattice constant of $In_xGa_{1-x}As_yP_{1-y}$—lattice constant of InP)/(lattice constant of InP), obtained at a room temperature. The amount of Ga in the melt is held at 0.9 atom %. It is seen from this graph that, by a suitable selection of the quantities of Ga and As in the In melt and by adding in excess the InP single crystal as the substrate crystal to the melt, precipitation is caused to occur on the InP single crystal in the melt during the melt cooling process, and consequently the composition ratio of the melt at the start of epitaxial growth is controlled, making it possible to control a difference between lattice constants of the $In_xGa_{1-x}As_yP_{1-y}$ and the InP substrate.

In the above embodiment, the substrate crystal and the single crystal in the melt are both InP of the (100) plane but they may also be of other Miller indices and, further, the Miller indices of the substrate and the single crystal in the melt need not always be selected to be the same. That is to say, a constant value of the above-mentioned difference can be obtained. with the melt as long as the Miller indices of the plane of the single crystal contacting and the area of the single crystal plane are maintained at predetermined constant values even if single crystals of other Miller indices may be in contact with the melt. Moreover, the crystals may also be fixed, for instance, in the melt reservoir 3 or at one part of the substrate support 1.

Further, in the foregoing embodiment, the InAs and GaAs polycrystals and the InP crystal are used for saturating Ga, As and P in In but, for this saturation, simple substances such, for example, Ga, As and P as well as the abovesaid compounds may also be employed.

Although the above embodiment has been described with regard to the case of growing the $In_xGa_{1-x}As_yP_{1-y}$ crystal on the InP substrate, the crystal growth method of this invention is also applicable to a case where a compound semiconductor different from or of the same kind as the substrate is grown on the substrate of another III–V compound semiconductor crystal such, for example, as GaAs, GaP, GaSb, InAs, $GaAsP_{1-y}$ or $GaIn_{1-x}Sb$.

Figure 3:
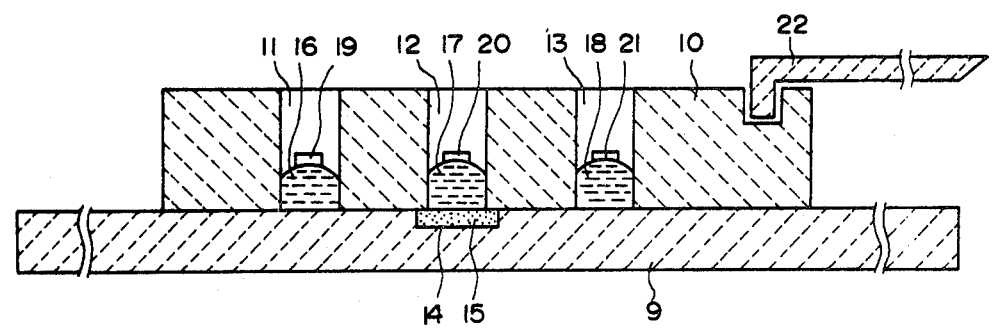
FIGS. 3, 4 and 5 are longitudinal sections each illustrating another example of crystal growing devices for use in this invention.

Moreover, also in a case of growing a multilayer film on the substrate crystal, the crystal growth method of this invention can be applied, for instance, by adding to a melt 17 in the reservoir 12 (or 11 or 13) the same single crystal 20 as a growth layer immediately preceding a growth layer formed by the melt 17 in a growth device using a substrate support 9, a slide plate 10, a substrate crystal 14, a groove 15 and a moving rod 22 such as shown in FIG. 3. It is also possible, of course, to apply this invention by adding single crystals 19 and 21 to melts 16 and 18 at the same time.

Figure 4:
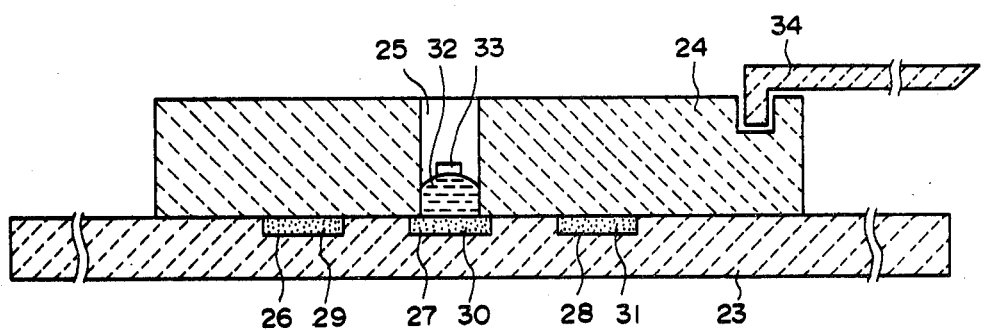
Figure 5:
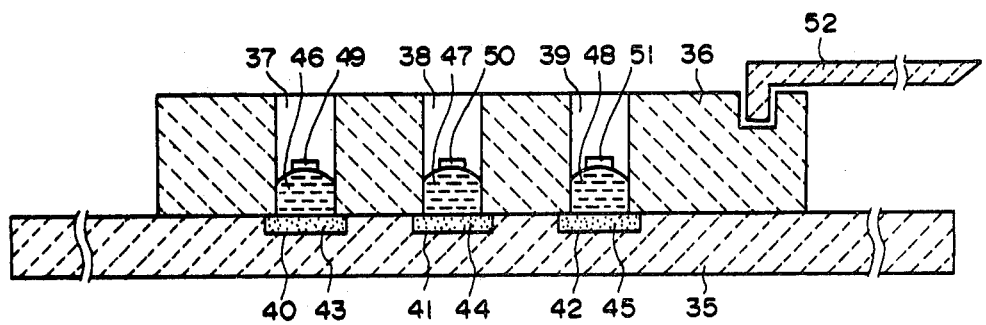

Also in cases of continuously growing single- or multilayer crystals on a plurality of substrate crystals, 29, 30, 31 or 43, 44, 45 in respective grooves 26, 27, 28 or 40, 41 42 the crystal growth method of this invention can be applied, for example, by adding to melts 32, 46, 47 and 48 in respective reservoirs 25, 37, 38 and 39 the same single crystal 33 as the substrate and, in the case of the multi-layer crystal growth, the same single crystals 49, 50 and 51 as a growth layer immediately preceding a certain growth layer in such crystal growing devices as depicted in FIGS. 4 and 5. In this instance, it is desirable for continuous operation to provide temperature gradients in each melt.

In the above embodiments, 1, 9, 23 and 35 are substrates' supports and 2, 10, 24 and 36 are slide plates but the same results as those obtained in the above are also obtainable in the cases where the slide plates 2, 10, 24 and 36 controlled by respective moving rods 8, 22, 34 and 52 are replaced by fixed boats and the substrate supports 1, 9, 23 and 35 are replaced by slide plates.

If a semiconductor layer grown by the method according to the present invention is used as an active layer of a double-hetro LED or laser, such an LED or laser can be produced by preparing an n-type layer and a p-type layer, both adjacent the active layer, without introducing any dopants into the active layer. Moreover, desired dopants may be introduced by diffusion after growing the crystal. The dopants may also be included in the melt.

As has been described in the foregoing, in a case of growing on a III–V compound semiconductor substrate a compound semiconductor of the same kind as or different from the substrate, the composition ratio of the solution can be easily controlled in accordance with this invention, and consequently the composition and lattice constant of the grown crystal can be readily controlled with good reproducibility. Thus, the present invention is of great industrial value.

What we claim is:

1. In a method for liquid phase epitaxially growing a III–V compound semiconductor crystal comprising at least four constituent elements, the improvement comprising: providing a melt of the III–V compound semiconductor on a two-element single crystal substrate; providing another two-element single crystal having the same composition as said substrate and in contact with said melt; and selecting a contact area between the two-element single crystal and the melt and the Miller index of the single crystal for determining the composition of III–V compound semiconductor crystals grown by liquid phase epitaxial growth on said substrate and for minimizing any difference between crystal lattice constants of the III-V compound semiconductor crystals grown on said substrate and said substrate.

2. A method according to claim 1, in which Miller indices of the substrate and the single crystal are the same as each other.

3. A method according to claim 2, in which said Miller indices are of (100) plane.

4. A method according to claim 1, in which Miller indices of the substrate and the single crystal are different from each other.

5. A method according to claim 1, wherein said substrate is InP and said III-V compound semiconductor is comprised of In, Ga, As and P.